(12) United States Patent
Nakamura et al.

(10) Patent No.: US 10,886,184 B2
(45) Date of Patent: Jan. 5, 2021

(54) TEST CONDITION DETERMINING APPARATUS AND TEST CONDITION DETERMINING METHOD

(71) Applicant: Mitsubishi Electric Corporation, Tokyo (JP)

(72) Inventors: Takuyo Nakamura, Tokyo (JP); Masashi Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 57 days.

(21) Appl. No.: 16/168,354

(22) Filed: Oct. 23, 2018

(65) Prior Publication Data

US 2019/0221485 A1 Jul. 18, 2019

(30) Foreign Application Priority Data

Jan. 15, 2018 (JP) .................................. 2018-003978

(51) Int. Cl.
| | | |
|---|---|---|
| *H01L 21/66* | (2006.01) | |
| *G01R 31/28* | (2006.01) | |
| *H01L 21/67* | (2006.01) | |
| *H01L 23/544* | (2006.01) | |

(52) U.S. Cl.
CPC .......... *H01L 22/14* (2013.01); *G01R 31/2831* (2013.01); *H01L 21/67288* (2013.01); *H01L 22/12* (2013.01); *H01L 23/544* (2013.01)

(58) Field of Classification Search
CPC ....... H01L 22/14; H01L 23/544; H01L 22/12; H01L 21/67288; G01R 31/2831
USPC ...... 324/762.01–763.02, 508, 500, 523–533, 324/600, 750.01–754.19, 756.01, 757.01, 324/758.01, 759.01–762.01, 555, 612, 324/639, 659, 701
See application file for complete search history.

(56) References Cited

U.S. PATENT DOCUMENTS

| | | | | |
|---|---|---|---|---|
| 6,201,257 B1* | 3/2001 | Stettner | .................. | B82Y 10/00 257/10 |
| 2015/0024520 A1* | 1/2015 | Tanaka | .................... | H01L 22/12 438/14 |
| 2018/0218096 A1* | 8/2018 | Yu | .......................... | G06F 30/398 |

FOREIGN PATENT DOCUMENTS

JP 2011-258683 A 12/2011

* cited by examiner

*Primary Examiner* — Vincent Q Nguyen
*Assistant Examiner* — Trung Nguyen
(74) *Attorney, Agent, or Firm* — Studebaker & Brackett PC

(57) ABSTRACT

The object is to provide a technique for enabling determination of an appropriate test condition. A test condition determining apparatus includes a map generating unit, a withstand voltage estimating unit, and a test condition determining unit. The map generating unit generates a wafer map relevant to a plurality of chips, based on measurement values of thicknesses and carrier concentrations of an epitaxial growth layer, and measurement results of crystal defects in the epitaxial growth layer and a substrate. The withstand voltage estimating unit estimates a withstand voltage of each of the chips based on the wafer map. The test condition determining unit determines a test condition of a test to be conducted on the chips, based on a result of the estimation made by the withstand voltage estimating unit.

8 Claims, 6 Drawing Sheets

F I G. 1
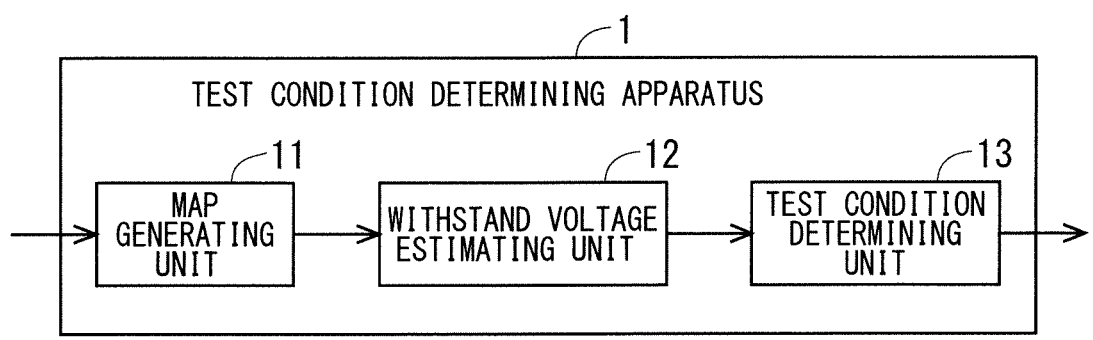

TEST CONDITION DETERMINING APPARATUS AND TEST CONDITION DETERMINING METHOD

BACKGROUND OF THE INVENTION

Field of the Invention

The present invention relates to a test condition determining apparatus that determines a test condition, and a test condition determining method.

Description of the Background Art

Various techniques for testing substrates on each of which an epitaxial growth layer is disposed have been proposed to increase the quality of semiconductor devices (for example, Japanese Patent Application Laid-Open No. 2011-258683). Normally, withstand voltage tests on semiconductor elements each including a substrate and an epitaxial growth layer are conducted by bringing a probe in contact with an electrode disposed on a surface of the semiconductor element.

However, when the number of crystal defects in the epitaxial growth layer and the substrate per unit area exceeds a fixed value, the withstand voltage of the semiconductor element decreases. When the withstand voltage test is conducted with the maximum rating value on the semiconductor element whose withstand voltage has decreased, the semiconductor element may be damaged, thus causing a problem with damaging an electrode (stage) or the probe on a tester side.

SUMMARY

The present invention has been conceived in view of the problem, and the object is to provide a technique for enabling determination of an appropriate test condition.

A test condition determining apparatus according to the present invention includes a map generating unit, a withstand voltage estimating unit, and a test condition determining unit. The map generating unit generates a wafer map relevant to a plurality of chips, based on measurement values of thicknesses and carrier concentrations of an epitaxial growth layer, and measurement results of crystal defects in the epitaxial growth layer and a substrate, the measurement values and the measurement results being obtained from a plurality of portions of the substrate on which the epitaxial growth layer is disposed. The withstand voltage estimating unit estimates a withstand voltage of each of the chips based on the wafer map generated by the map generating unit. The test condition determining unit determines a test condition of a test to be conducted on the chips, based on a result of the estimation made by the withstand voltage estimating unit.

Consequently, an appropriate test condition can be determined.

BRIEF DESCRIPTION OF THE DRAWINGS

FIG. 1 is a block diagram illustrating a configuration of a test condition determining apparatus according to Embodiment 1;

DESCRIPTION OF THE PREFERRED EMBODIMENTS

Embodiment 1

FIG. 1 is a block diagram illustrating a configuration of a test condition determining apparatus 1 according to Embodiment 1 of the present invention. The test condition determining apparatus 1 is an apparatus that determines test conditions of a test to be conducted on chips in a substrate on which an epitaxial growth layer is disposed. The test condition determining apparatus 1 determines test conditions of a test to be conducted on chips in, for example, an n-type silicon carbide (SiC) substrate on which an n-type SiC epitaxial growth layer is disposed and whose impurity concentration is higher than that of the epitaxial growth layer. In the following description, a wafer is synonymous with a substrate, and a chip is synonymous with a semiconductor element.

As illustrated in FIG. 1, the test condition determining apparatus 1 includes a map generating unit 11, a withstand voltage estimating unit 12, and a test condition determining unit 13.

The map generating unit 11 obtains, from a plurality of portions of a substrate on which an epitaxial growth layer is disposed, measurement values of thicknesses of the epitaxial growth layer, measurement values of carrier concentrations of the epitaxial growth layer, and measurement results of crystal defects in the epitaxial growth layer and the substrate. Then, the map generating unit 11 generates a wafer map relevant to the chips based on these measurements.

Figure 2:
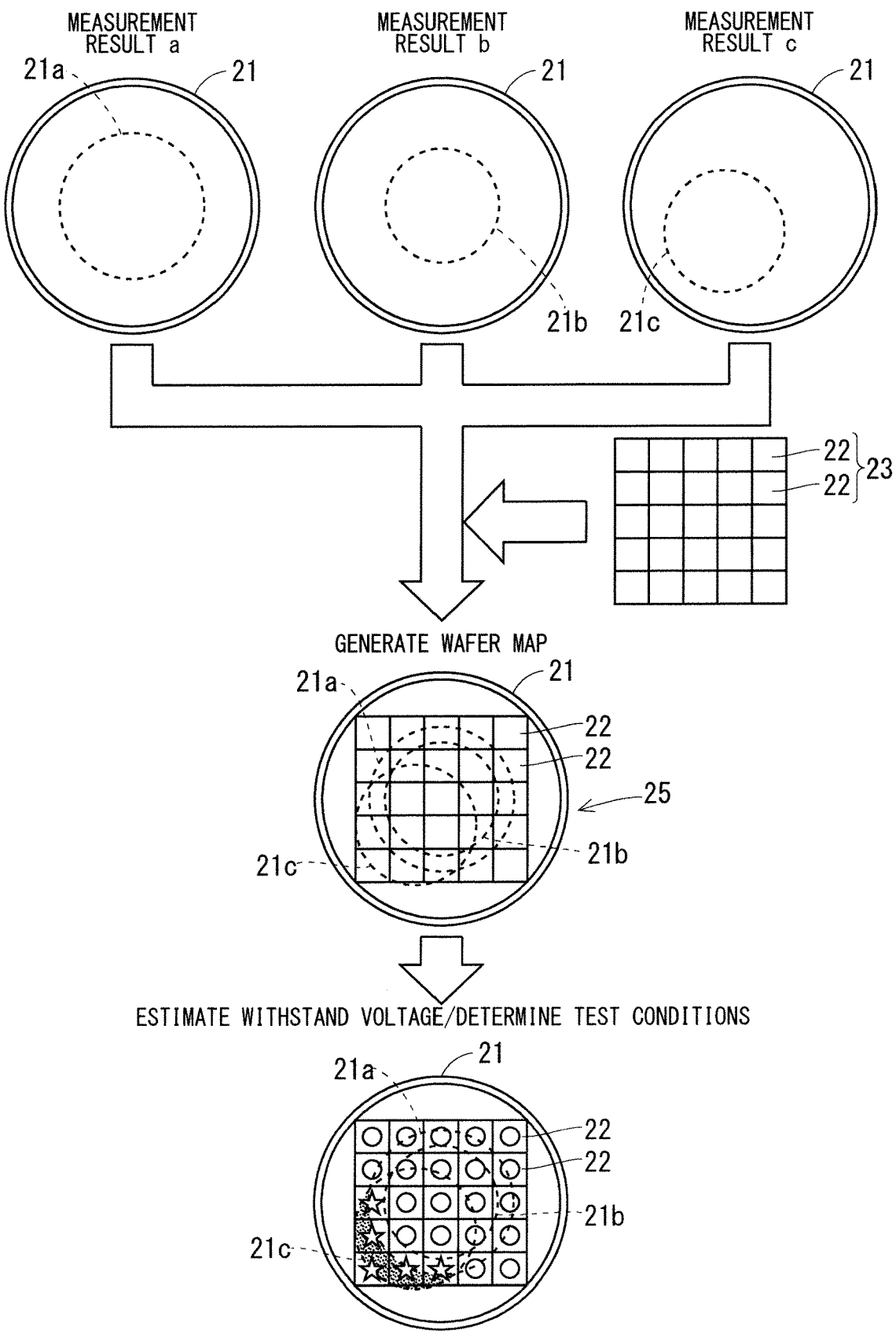
FIG. 2 schematically illustrates operations of the test condition determining apparatus according to Embodiment 1.

FIG. 2 schematically illustrates operations of the test condition determining apparatus 1 according to Embodiment 1.

A measurement result a of FIG. 2 corresponds to measurement values of thicknesses of the epitaxial growth layer. A region 21a is a region of a wafer 21 in which the thicknesses have been measured, and is a region distinguished from the other regions by a threshold for the thicknesses. A relatively high withstand voltage is expected from the thicknesses. The thicknesses of the epitaxial growth layer are preferably measured by reflectance interferometry using a Fourier-transform infrared spectroscopy.

A measurement result b of FIG. 2 corresponds to measurement values of carrier concentrations of the epitaxial growth layer. A region 21b is a region of the wafer 21 in which the carrier concentrations have been measured and is a region distinguished from the other regions by a threshold for the carrier concentrations. A relatively high withstand voltage is expected from the carrier concentrations. The carrier concentrations of the epitaxial growth layer are preferably measured by a method for measuring C-V characteristics using a mercury electrode.

A measurement result c of FIG. 2 corresponds to measurement results of crystal defects in the epitaxial growth layer and the substrate. A region 21c is a region of the wafer 21 in which defect species and defect densities have been measured, and is a region distinguished from the other regions by a threshold for the defect species or the defect densities. A relatively low withstand voltage is expected from the defect species and the defect densities. The crystal defects in the epitaxial growth layer and the substrate are preferably measured and evaluated by X-ray topography.

The map generating unit 11 generates a wafer map 25 on a plurality of chips 22 as illustrated in FIG. 2, based on the measurement values of the thicknesses of the epitaxial growth layer, the measurement values of the carrier concentrations of the epitaxial growth layer, and the measurement results of the crystal defects in the epitaxial growth layer and the substrate. In the example of FIG. 2, the map generating unit 11 generates the wafer map 25 by overlaying the measurement results a, b, and c on an element array 23 that is an array with the plurality of chips 22.

The withstand voltage estimating unit 12 estimates a withstand voltage of each of the chips based on the wafer map 25 generated by the map generating unit 11. The combinations of inside and outside the regions 21a, 21b, and 21c in the wafer map 25 in FIG. 2 enable estimation of the maximum eight levels of withstand voltages. Obviously, increase in the number of divisions of measurement values to be used for generating a wafer map can increase the number of levels of withstand voltages to be estimated. In the example of FIG. 2, it is estimated that the withstand voltages of the chips 22 most of whose region does not belong to the region 21a or the region 21b among the chips 22 belonging to the region 21c are lower than the withstand voltages of the other chips 22.

The test condition determining unit 13 determines test conditions of a test to be conducted on the chips, based on a result of the estimation made by the withstand voltage estimating unit 12. In the example of FIG. 2, the test condition determining unit 13 determines a test flow A (marked with stars) for the chips 22 whose withstand voltages are estimated to be relatively low, that is, the chips 22 roughly in the hatching in FIG. 2. On the other hand, the test condition determining unit 13 determines a test flow B (marked with circles) for the chips 22 whose withstand voltages are estimated to be not relatively low. The test condition determining unit 13 may determine not only the type of a test condition but also details of each test condition, for example, a value of a voltage to be applied.

Figure 3:
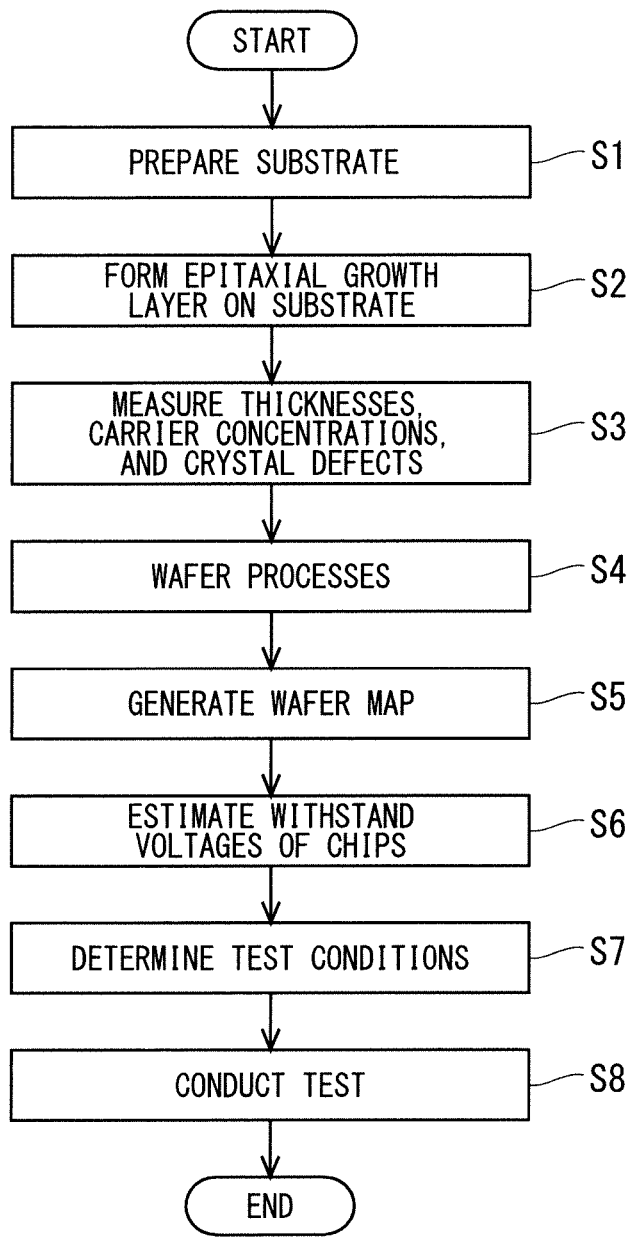
FIG. 3 is a flowchart illustrating a method for manufacturing a semiconductor device according to Embodiment 1.

FIG. 3 is a flowchart illustrating a method for manufacturing a semiconductor device to which the test condition determining apparatus 1 is applied, according to Embodiment 1.

In Step S1, a substrate (wafer) is prepared. In Step S2, an epitaxial growth layer is formed on the substrate by epitaxial growth.

In Step S3, thicknesses and carrier concentrations of the epitaxial growth layer, and crystal defects in the epitaxial growth layer and the substrate are measured. In Step S4, wafer processes involving, for example, photolithography and implanting ions are performed to form a plurality of chips on the wafer (hereinafter "wafer processes" indicate processes to be performed on an epitaxially grown wafer" in the Specification). Consequently, semiconductor elements, such as a metal-oxide-semiconductor field-effect transistor (MOSFET), an insulated-gate bipolar transistor (IGBT), and a diode are formed on the substrate.

In Step S5 immediately before the test on the semiconductor elements, the map generating unit 11 generates a wafer map based on the measurement values and the measurement results in Step S3. In Step S6, the withstand voltage estimating unit 12 estimates a withstand voltage of each of the chips based on the wafer map. In Step S7, the test condition determining unit 13 determines test conditions of a test to be conducted on the chips, based on a result of the estimation on the withstand voltages.

In Step S8, a test apparatus that is not illustrated conducts a test relevant to the chips according to the test conditions determined by the test condition determining unit 13. Then, the processes in FIG. 3 end.

Gist of Embodiment 1

The test condition determining apparatus 1 according to Embodiment 1 generates a wafer map based on measurement values of thicknesses and carrier concentrations of an epitaxial growth layer, and measurement results of crystal defects in the epitaxial growth layer and a substrate, estimates a withstand voltage of each chip based on the wafer map, and determines a test condition of a test to be conducted on the chips, based on a result of the estimation on the withstand voltages. Such a structure enables determination of a test condition under which semiconductor elements, electrodes, a probe, a tester, etc. can be prevented from being destroyed, that is, an appropriate test condition. Thus, the semiconductor elements, the electrodes, the probe, the tester, etc. can be prevented from being destroyed. Consequently, it is possible to expect increase in the productivity or prevention of chips from dropping off through effective use of the semiconductor elements with a low withstand voltage.

Modification 1 of Embodiment 1

The test condition determining unit 13 may determine, as determination of test conditions, whether a voltage in a withstand voltage test is applied or whether the withstand voltage test is conducted. Such a structure enables execution of a test that hardly destroys the semiconductor elements, the electrodes, the probe, and the tester.

Modification 2 of Embodiment 1

Figure 4:
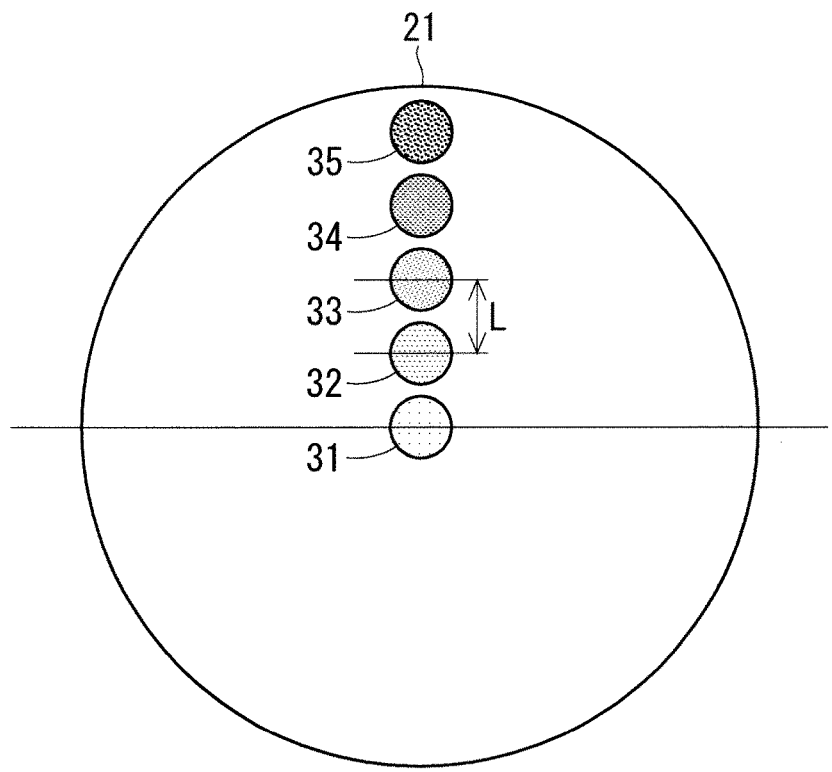
FIG. 4 illustrates the measurement according to Modification 2 of Embodiment 1.

According to the general epitaxial growth layer forming methods, thicknesses and carrier concentrations of epitaxial growth layers tend to concentrically differ on the wafer. Thus, the thicknesses and the carrier concentrations of the epitaxial growth layer may be measured from the center of the wafer 21 at fixed intervals L (for example, 1 cm) along the radius of the wafer 21 as illustrated in FIG. 4. In the example of FIG. 4, the thicknesses and the carrier concentrations of the epitaxial growth layer are measured at portions 31, 32, 33, 34, and 35.

Figure 5:
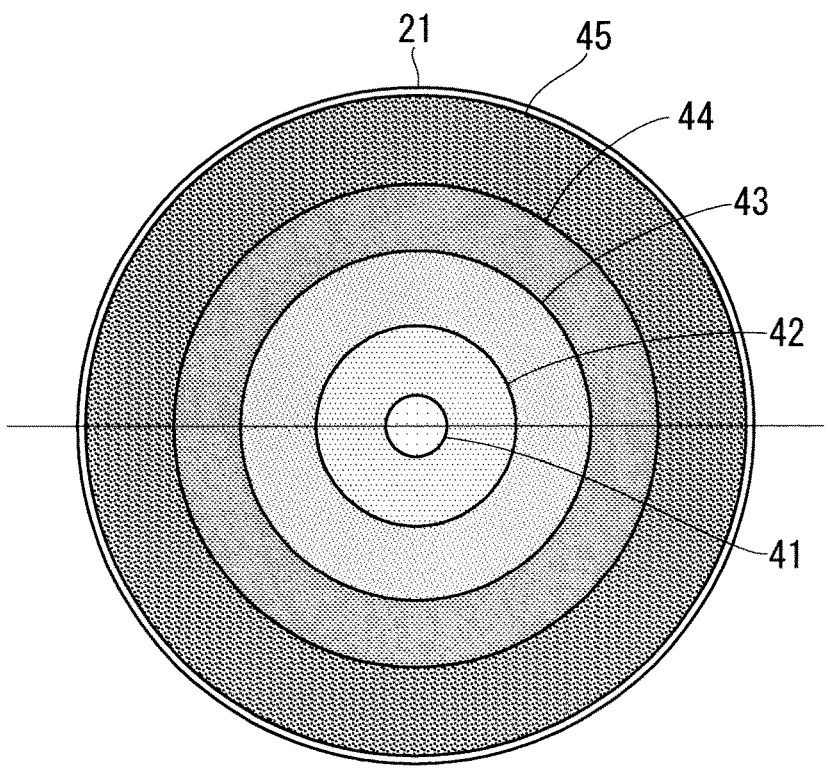
FIG. 5 illustrates the measurement according to Modification 2 of Embodiment 1.

As illustrated in FIG. 5, the thickness of the epitaxial growth layer in a round region 41 may be the same as that of the epitaxial growth layer in the portion 31, and the thicknesses of the epitaxial growth layer in ring-shaped regions 42 to 45 may be the same as those of the epitaxial growth layer in the portions 32 to 35, respectively. Similarly, the carrier concentration of the epitaxial growth layer in the round region 41 may be the same as that of the epitaxial growth layer in the portion 31, and the carrier concentrations of the epitaxial growth layer in the ring-shaped regions 42 to 45 may be the same as those of the epitaxial growth layer in the portions 32 to 35, respectively.

Modification 2 can reduce the number of measurement portions of the epitaxial growth layer for the thicknesses and the carrier concentrations. Although the number of measurement portions in the example of FIGS. 4 and 5 is 5 portions (portions 31 to 35), the number of measurement portions is not limed to this.

Modification 3 of Embodiment 1

Although the crystal defects in the epitaxial growth layer and the substrate are measured before the wafer processes intended for forming a plurality of chips, that is, a step before photolithography or implanting ions (FIG. 3), the measurement timing is not limed to this. The following will describe this.

Figure 6:
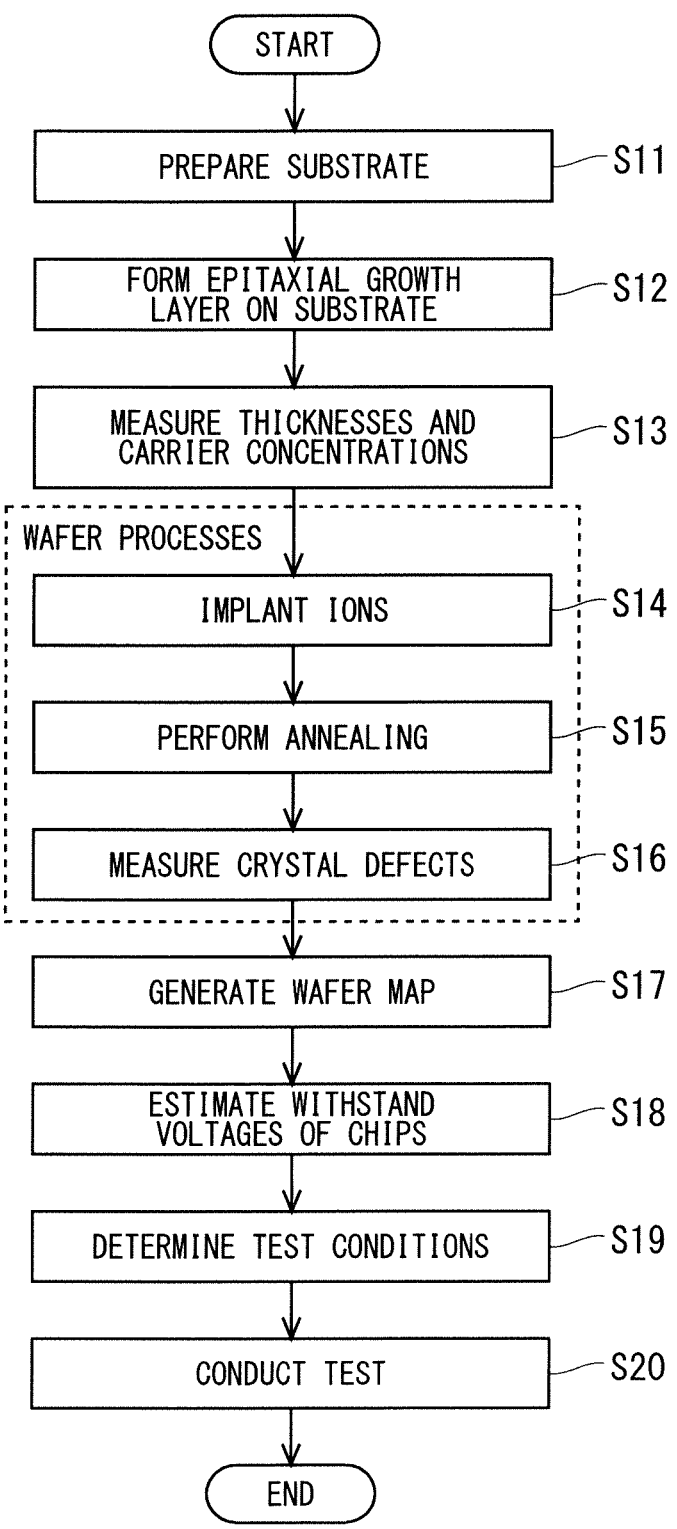
FIG. 6 is a flowchart illustrating a method for manufacturing a semiconductor device according to Modification 3 of Embodiment 1.

FIG. 6 is a flowchart illustrating a method for manufacturing a semiconductor device according to Modification 3.

First in Step S11, a substrate (wafer) is prepared. In Step S12, an epitaxial growth layer is formed on the substrate by epitaxial growth.

In Step S13, the thicknesses and the carrier concentrations of the epitaxial growth layer are measured. According to Modification 3, the crystal defects in the epitaxial growth layer and the substrate are not measured in this process.

In Step S14 in the wafer processes, ions are implanted into at least one of the epitaxial growth layer and the substrate.

In Step S15 in the wafer processes, annealing is performed to recover the crystallinity and activate the implanted ions.

In Step S16 in the wafer processes, the crystal defects in the epitaxial growth layer and the substrate are measured.

In Step S17 in the wafer processes, the map generating unit 11 generates a wafer map, based on the measurement values and the measurement results in Step S13 and Step S16, respectively.

In Step S18 in the wafer processes, the withstand voltage estimating unit 12 estimates a withstand voltage of each of the chips based on the wafer map.

In Step S19 in the wafer processes, the test condition determining unit 13 determines test conditions of a test to be conducted on the chips, based on a result of the estimation on the withstand voltages. The wafer processes end after finishing the last lot.

In Step S20, a test apparatus that is not illustrated conducts a test relevant to the chips according to the test conditions determined by the test condition determining unit 13. Then, the processes in FIG. 6 end.

Figure 7:
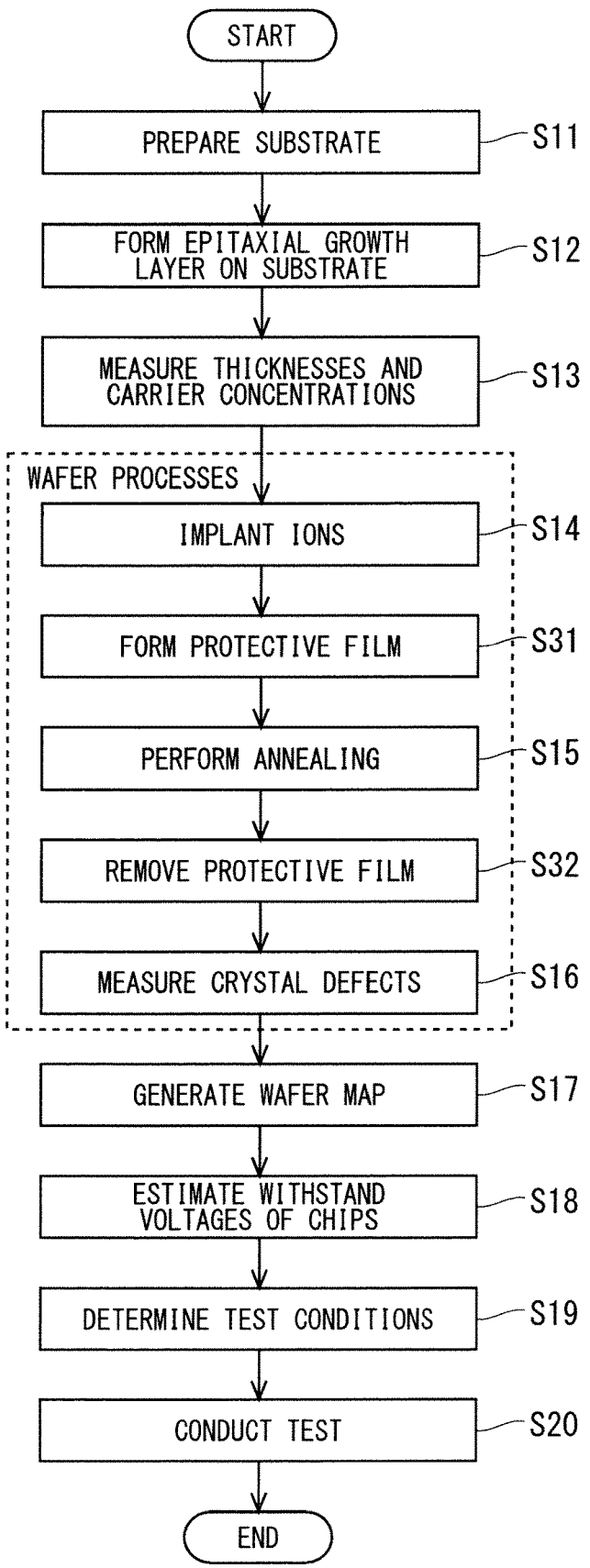
FIG. 7 is a flowchart illustrating a method for manufacturing a semiconductor device according to Modification 3 of Embodiment 1.

FIG. 7 is a flowchart illustrating another method for manufacturing a semiconductor device according to Modification 3. FIG. 7 is a combination of the manufacturing method in FIG. 6 and Steps S31 and S32. Thus, Steps S31 and S32 will be mainly described hereinafter.

In Step S14 after Steps S11 to S13 described with reference to FIG. 6, ions are implanted into at least one of the epitaxial growth layer and the substrate.

Then in Step S31 in the wafer processes, a protective film for annealing is formed on the substrate. Next in Step S15, annealing is performed to recover the crystallinity and activate the implanted ions.

Then in Step S32 in the wafer processes, the protective film for annealing is removed. Subsequently, the processes after Step S16 described with reference to FIG. 6 are performed.

In the processes of FIG. 6, implanting ions into at least one of the epitaxial growth layer and the substrate and then annealing to recover the crystallinity are followed by measuring the crystal defects in the epitaxial growth layer and the substrate. In the processes of FIG. 7, implanting ions into at least one of the epitaxial growth layer and the substrate, annealing to recover the crystallinity, and then removing the protective film for annealing are followed by measuring the crystal defects in the epitaxial growth layer and the substrate. These processes enable determination of test conditions using the crystal defects altered by the processes of implanting ions and annealing. Thus, the accuracy of determining test conditions can be increased.

[Others]

Although the substrate and the epitaxial growth layer contain silicon carbide, the material thereof is not limed to this. The substrate and the epitaxial growth layer may contain the other wide bandgap materials such as gallium nitride (GaN), or normal semiconductors such as silicon.

Embodiment and Modifications can be appropriately modified or omitted within the scope of the invention.

What is claimed is:

1. A test condition determining apparatus, comprising:
    a map generating unit that generates a wafer map relevant to chips, based on measurement values of thicknesses and carrier concentrations of an epitaxial growth layer, and measurement results of crystal defects in the epitaxial growth layer and a substrate, the measurement values and the measurement results being obtained from a plurality of portions of the substrate on which the epitaxial growth layer is disposed;
    a withstand voltage estimating unit that estimates a withstand voltage of each of the chips based on the wafer map generated by the map generating unit; and
    a test condition determining unit that determines a test condition of a test to be conducted on the chips, based on a result of the estimation made by the withstand voltage estimating unit.

2. The test condition determining apparatus according to claim 1,
    wherein the thicknesses of the epitaxial growth layer are measured by reflectance interferometry using a Fourier-transform infrared spectroscopy,
    the carrier concentrations of the epitaxial growth layer are measured by a method for measuring C-V characteristics using a mercury electrode, and
    the crystal defects in the epitaxial growth layer and the substrate are measured by X-ray topography.

3. The test condition determining apparatus according to claim 1,
    wherein the measurement values of thicknesses are mapped to the wafer,
    the measurement values of carrier concentrations of the epitaxial layer are mapped to the wafer, and
    the measurement results of crystal defects in the epitaxial growth layer and a substrate on which the epitaxial growth layer is disposed are mapped to the wafer.

4. The test condition determining apparatus according to claim 1,
    wherein the map generating unit generates the wafer map by overlaying the regions based on the measurement values of thickness, carrier concentrations, and crystal defects.

5. A test condition determining apparatus, comprising:
    a map generating unit that generates a wafer map relevant to chips, based on measurement values of thicknesses and carrier concentrations of an epitaxial growth layer, and measurement results of crystal defects in the epitaxial growth layer and a substrate, the measurement values and the measurement results being obtained from a plurality of portions of the substrate on which the epitaxial growth layer is disposed;

a withstand voltage estimating unit that estimates a withstand voltage of each of the chips based on the wafer map generated by the map generating unit; and a test condition determining unit that determines a test condition of a test to be conducted on the chips, based on a result of the estimation made by the withstand voltage estimating unit, wherein the thicknesses of the epitaxial growth layer are measured by reflectance interferometry using a Fourier-transform infrared spectroscopy, the carrier concentrations of the epitaxial growth layer are measured by a method for measuring C-V characteristics using a mercury electrode, the crystal defects in the epitaxial growth layer and the substrate are measured by X-ray topography, and the test condition determining unit determines, as determination of the test condition, whether to conduct a high withstand voltage test.

6. A test condition determining method comprising the steps of:
 (a) generating a wafer map relevant to chips, based on measurement values of thicknesses and carrier concentrations of an epitaxial growth layer, and measurement results of crystal defects in the epitaxial growth layer and a substrate, the measurement values and the measurement results being obtained from a plurality of portions of the substrate on which the epitaxial growth layer is disposed;
 (b) estimating a withstand voltage of each of the chips based on the wafer map generated in step (a); and
 (c) determining a test condition of a test to be conducted on the chips, based on a result of the estimation made in step (b).

7. The test condition determining method according to claim 6,
 wherein implanting ions into at least one of the epitaxial growth layer and the substrate and then annealing to recover crystallinity are followed by measuring the crystal defects in the epitaxial growth layer and the substrate.

8. The test condition determining method according to claim 6,
 wherein implanting ions into at least one of the epitaxial growth layer and the substrate, annealing to recover crystallinity, and then removing a protective film for annealing are followed by measuring the crystal defects in the epitaxial growth layer and the substrate.

\* \* \* \* \*